United States Patent
Lee et al.

(10) Patent No.: US 10,211,421 B2
(45) Date of Patent: Feb. 19, 2019

(54) FLEXIBLE FILM STRUCTURE, METHOD OF MANUFACTURING THE SAME, AND FLEXIBLE DISPLAY DEVICE INCLUDING THE SAME

(71) Applicant: SAMSUNG ELECTRONICS CO., LTD., Suwon-si, Gyeonggi-do (KR)

(72) Inventors: Ji-min Lee, Seoul (KR); Nam-il Koo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 39 days.

(21) Appl. No.: 15/258,170

(22) Filed: Sep. 7, 2016

(65) Prior Publication Data

US 2017/0179424 A1 Jun. 22, 2017

(30) Foreign Application Priority Data

Dec. 21, 2015 (KR) ........................ 10-2015-0182789

(51) Int. Cl.
*H01L 51/00* (2006.01)
*H01L 51/52* (2006.01)
*H01L 51/56* (2006.01)
*H01L 27/32* (2006.01)

(52) U.S. Cl.
CPC ...... *H01L 51/5237* (2013.01); *H01L 51/0097* (2013.01); *H01L 51/56* (2013.01); *H01L 27/323* (2013.01); *H01L 27/3225* (2013.01); *H01L 2251/5338* (2013.01)

(58) Field of Classification Search
CPC ......... H01L 2251/5338; H01L 27/3225; H01L 27/323; H01L 51/0097; H01L 51/5237; H01L 51/56
See application file for complete search history.

(56) References Cited

U.S. PATENT DOCUMENTS

| 2009/0002590 | A1* | 1/2009 | Kimura | H01L 27/1214 349/43 |
| 2011/0001146 | A1* | 1/2011 | Yamazaki | H05B 33/04 257/79 |
| 2014/0170424 | A1* | 6/2014 | Honda | B05D 3/007 428/446 |
| 2014/0355227 | A1* | 12/2014 | Lim | H05K 1/028 361/749 |

(Continued)

FOREIGN PATENT DOCUMENTS

| KR | 10-2009-0044089 A | 5/2009 |
| KR | 10-2009-0120275 A | 11/2009 |

(Continued)

OTHER PUBLICATIONS

Google english translation of KR1020140095773A.*

(Continued)

*Primary Examiner* — Tom Thomas
*Assistant Examiner* — Benjamin Tzu-Hung Liu
(74) *Attorney, Agent, or Firm* — Lee & Morse, P.C.

(57) ABSTRACT

A flexible film structure, a method of manufacturing the flexible film structure, and a flexible display device, the flexible film structure including a base film; and at least one functional hard coating layer on the base film, wherein the functional hard coating layer includes a siloxane polymer having an epoxy group.

16 Claims, 25 Drawing Sheets

(56) References Cited

U.S. PATENT DOCUMENTS

| | | | | |
|---|---|---|---|---|
| 2016/0046830 A1* | 2/2016 | Kim | ................... | C09D 151/085 |
| | | | | 428/412 |
| 2016/0085319 A1* | 3/2016 | Kim | ..................... | G06F 3/0346 |
| | | | | 345/156 |
| 2016/0117004 A1* | 4/2016 | Lee | ........................ | G06F 3/041 |
| | | | | 428/323 |
| 2016/0195983 A1* | 7/2016 | Miyake | ................ | G06F 3/0416 |
| | | | | 345/174 |

FOREIGN PATENT DOCUMENTS

| | | | |
|---|---|---|---|
| KR | 10-2010-0117438 A | | 11/2010 |
| KR | 10-1016215 B1 | | 2/2011 |
| KR | 10-1329218 B1 | | 11/2013 |
| KR | 20140095773 A | * | 8/2014 |
| KR | 10-1526648 B1 | | 6/2015 |
| KR | 10-1538776 B1 | | 7/2015 |

OTHER PUBLICATIONS

Chen, et al., "Scratch Resistance of Brittle Thin Films on Compliant Substrates" Materials Science and Engineering A 493 (2008) pp. 292-298.
His Markit "Flexible Display Market to Reach Nearly 800 Million Unit Shipments by 2020" (2013) http://press.ihs.com/press-release/design-supply-chain/flexible-display-market-reach-nearly-800-million-unit-shipments-20.

* cited by examiner

FIG. 11

| MATERIAL | THICKNESS | PENCIL HARDNESS |
|---|---|---|
| BASE FILM | 100μm OR LESS | 5B |
| FUNCTIONAL HARD COATING LAYER | 1μm | 2H |
| | 3μm | 3H |
| | 5μm | 4H |
| | 30μm | 8H |

FLEXIBLE FILM STRUCTURE, METHOD OF MANUFACTURING THE SAME, AND FLEXIBLE DISPLAY DEVICE INCLUDING THE SAME

CROSS-REFERENCE TO RELATED APPLICATION

Korean Patent Application No. 10-2015-0182789, filed on Dec. 21, 2015, in the Korean Intellectual Property Office, and entitled: "Flexible Film Structure, Method of Manufacturing the Same, and Flexible Display Device Including the Same," is incorporated by reference herein in its entirety.

BACKGROUND

1. Field

Embodiments relate to a flexible film structure, a method of manufacturing the same, and a flexible display device including the same.

2. Description of the Related Art

A flexible display device, e.g., a flexible organic light-emitting display device, may include a flexible display substrate and an encapsulation layer formed from a flexible material, and the flexible display device may be bent or folded.

SUMMARY

Embodiments are directed to a flexible film structure, a method of manufacturing the same, and a flexible display device including the same.

The embodiments may be realized by providing a flexible film structure including a base film; and at least one functional hard coating layer on the base film, wherein the functional hard coating layer includes a siloxane polymer having an epoxy group.

The embodiments may be realized by providing a flexible film structure including a base film; a first functional hard coating layer on the base film, a barrier layer on the first functional hard coating layer; and a second functional hard coating layer on the barrier layer, wherein each of the first functional hard coating layer and the second functional hard coating layer includes a siloxane polymer having an epoxy group.

The embodiments may be realized by providing a method of manufacturing a flexible film structure, the method including preparing a base film; coating a functional hard coating layer onto the base film such that the functional hard coating layer includes a siloxane polymer having an epoxy group; prebaking the functional hard coating layer; hardening the prebaked functional hard coating layer; post-baking the hardened functional hard coating layer; and cutting the base film and the post-baked functional hard coating layer.

The embodiments may be realized by providing a flexible display device including a flexible display panel configured to display an image on at least one surface thereof; and a window cover on the at least one surface of the flexible display panel, wherein the window cover includes a flexible film structure, the flexible film structure including a base film and at least one first functional hard coating layer on the base film, and wherein the at least one first functional hard coating layer includes a siloxane polymer having an epoxy group.

The embodiments may be realized by providing a flexible display device including a flexible display panel that displays an image on at least one surface thereof; and a window cover on the at least one surface of the flexible display panel, wherein the window cover includes a flexible film structure, the flexible film structure including a base film and a first functional hard coating layer on one side the base film, and wherein the first functional hard coating layer includes a siloxane polymer that is crosslinked via an epoxy group.

BRIEF DESCRIPTION OF THE DRAWINGS

Features will be apparent to those of skill in the art by describing in detail exemplary embodiments with reference to the attached drawings in which:

FIG. 11 illustrates a table showing the pencil hardness of a flexible film structure according to an embodiment;

DETAILED DESCRIPTION

Figure 1:
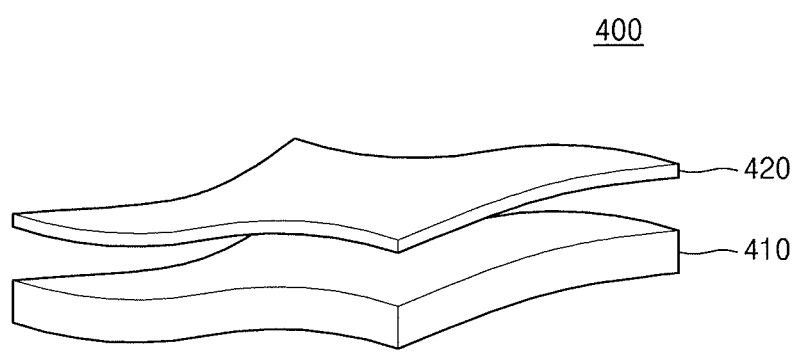
FIG. 1 illustrates an exploded perspective view of a flexible film structure according to an embodiment.

FIG. 1 illustrates an exploded perspective view of a flexible film structure 400 according to an embodiment.

The flexible film structure 400 may include, e.g., a base film 410 and at least one functional hard coating layer 420 on the base film 410. The functional hard coating layer 420 may be a coating layer obtained by hardening a material coated on the base film 410, e.g., by hardening the material via ultraviolet irradiation. The functional hard coating layer 420 may be a hardened coating layer, which may have different properties relative to a soft coating layer. In FIG. 1, only one functional hard coating layer 420 is illustrated for convenience.

The flexible film structure 400 may be a film structure that may be bent or folded, e.g. may be bendable or foldable without causing damage to the flexible film structure 400. In FIG. 1, the base film 410 and the functional hard coating layer 420 are illustrated as being separated from each other for convenience.

The base film 410 may be a film that may be bent or folded. The base film 410 may include a transparent material having high transmissivity in the range of visible light. In an implementation, a thickness of the base film 410 may be less than about 100 μm, e.g., about 50 μm to 100 μm. In an implementation, the base film 410 may be, e.g., a glass film, a plastic film, or a metal film.

The glass film may be a thin sheet-shaped film. In an implementation, the glass film may be a fused silica film. In an implementation, the plastic film may include, e.g., polyimide (PI), polycarbonate (PC), polyethersulfone (PES), polyethylene terephthalate (PET), polyethylenenaphthalate (PEN), polyarylate (PAR), polymethylmethacrylate (PMMA), or fiber glass reinforced plastic (FRP). The metal film may be a thin sheet-shaped film.

In an implementation, the functional hard coating layer 420 may have a thickness of, e.g., about 5 μm to 30 μm. The functional hard coating layer 420 may be a coating layer that has high transmissivity and high durability, e.g., high hardness and high chemical resistance. In an implementation, the functional hard coating layer 420 may include, e.g., a siloxane polymer having an epoxy group.

In an implementation, a weight-average molecular weight (Mw) of the siloxane polymer may be, e.g., about 1,500 to 2,100 g/mole. In an implementation, a number-average molecular weight (Mn) of the siloxane polymer may be, e.g., about 1,300 to 1,700 g/mole. A structure material of the functional hard coating layer 420 is described in detail below.

Polysiloxane forming the siloxane polymer may be an intermediate material between inorganic silica ($SiO_2$) and organic silicon or silicone ($R_2SiO$)n (where R denotes an organic group and n is an integer). In an implementation, the polysiloxane may have inorganic characteristics, such as heat-resistance and hardness, and organic characteristics, such as solubility.

The polysiloxane may be uniformly mixed with a suitable general-purpose resin, unlike insoluble silica, which is a pure inorganic material. Thus, mixing the polysiloxane with resin and preparing, processing, and shaping the polysiloxane may be facilitated. The polysiloxane may be a material in which an organic unit and an inorganic unit are compounded at a molecular level, and suitable organic functional groups may be introduced in or on the inorganic unit.

When the polysiloxane is mixed with an initiator, the polysiloxane may be easily hardened by light or heat. In an implementation, the external appearance of the polysiloxane before hardening may have the form of a colorless and transparent viscous liquid. In an implementation, the polysiloxane may have an organic-inorganic nanohybrid structure, in which an organic area and an inorganic area seem to be compounded in a molecular level, when crosslinking (hardening) between molecules proceeds. A hardened product of the polysiloxane may have certain characteristics, e.g., transparency, high hardness, high heat-resistance, and high weather prop. In an implementation, a weight-average molecular weight (Mw) and a number-average molecular weight (Mn) of the polysiloxane may be, e.g., about 1,500 to 2,100 g/mole and about 1,300 to 1,700 g/mole, respectively. In an implementation, the polysiloxane may include an organic solvent.

An epoxy group may be included in the polysiloxane as a functional group. The polysilocane may be hardened through a crosslinking reaction of the epoxy group. Accordingly, the polysiloxane may be hardened by heat or light. In an implementation, if desired, a wetting agent, a slip agent, or a pigment may be added to the polysiloxane.

The functional hard coating layer 420 may have high pencil hardness when it has a small thickness. In an implementation, the functional hard coating layer 420 may have pencil hardness of about 4H to 8H when it has a thickness of about 5 μm to 30 μm.

The transmissivity of the flexible film structure 400 including the functional hard coating layer 420 may be similar to that of a glass in the range of visible light. In an implementation, when the base film 410 has a thickness of about 100 μm or less, e.g., a thickness of about 50 μm to 100 μm, the flexible film structure 400 may have transmissivity of about 90% to 92% in a visible band, e.g., in which an optical wavelength is about 450 nm to 700 nm.

In a bending test of hundreds of thousands of times, e.g., 200,000 times, the flexible film structure 400 may not be, e.g., permanently bent or damaged, and may have good bending characteristics. For example, after bending 200,000 times, the flexible film structure 400 may maintain its flexibility and transmissivity similar to or the same as a state of the flexible film structure 400 prior to bending. In an implementation, in a salt spray test in which 5% salt water (NaCl) is sprayed on the flexible film structure 400 for tens of hours, the transmissivity of the flexible film structure 400 may be unchanged or nearly unchanged. Accordingly, the flexible film structure 400 may have excellent bending characteristics and excellent chemical resistance.

The flexible film structure 400 may be adopted as a window cover of a flexible display device, as will be described below. In this case, due to the flexible film structure 400, the flexible display device may easily perform a display function and a bending or folding function and may also be prevented from an external impact.

Figure 2:
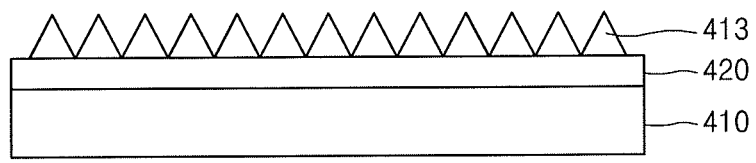
FIG. 2 illustrates a cross-sectional view of a flexible film structure according to an embodiment.

FIG. 2 illustrates a cross-sectional view of a flexible film structure 400-1 according to an embodiment.

The flexible film structure 400-1 of FIG. 2 may be substantially the same as the flexible film structure 400 of FIG. 1 except that the flexible film structure 400-1 may further include a transmissivity enhancement layer 413. In FIG. 2, reference numerals that are the same as those of FIG. 1 denote elements that are the same as those of FIG. 1, and descriptions of the same elements may be omitted or only briefly provided for convenience.

The flexible film structure 400-1 may include a base film 410, a functional hard coating layer 420 on the base film 410, and the transmissivity enhancement layer 413 on the functional hard coating layer 420. The functional hard coating layer 420 may be a coating layer obtained by hardening a material layer coated on the base film 410, e.g., by hardening the material via ultraviolet irradiation.

In an implementation, the transmissivity enhancement layer 413 may include, e.g., a nano-sized wrinkle structure for transmissivity improvement. For example, the wrinkle structure may include repeatedly arranged peaks and valleys. In an implementation, the transmissivity enhancement layer 413 may be a nano-sized antireflection layer for transmissivity improvement. In an implementation, the transmissivity enhancement layer 413 may include a material layer that helps improve the transmissivity of light passing through the base film 410 and the functional hard coating layer 420. In an implementation, the transmissivity enhancement layer 413 may include a material layer that helps improve an extraction efficiency of light passing through the base film 410 and the functional hard coating layer 420.

In an implementation, a cross-section of the transmissivity enhancement layer 413 may have a triangle shape. In an implementation, as illustrated in FIG. 2, the wrinkle structure of the transmissivity enhancement layer 413 may be uniformly formed at regular intervals. In an implementation, the wrinkle structure may be irregularly formed. The wrinkle structure may have a nanosize. In an implementation, the transmissivity enhancement layer 413 may include a suitable polymer, e.g., melamine or acrylic. In an implementation, the transmissivity enhancement layer 413 may be formed by using a stamping process. The stamping process may be a process of transferring an uneven shape of a mold mounted in a pressure roller to the surface of the transmissivity enhancement layer 413 by using heat and pressure.

Figure 3:
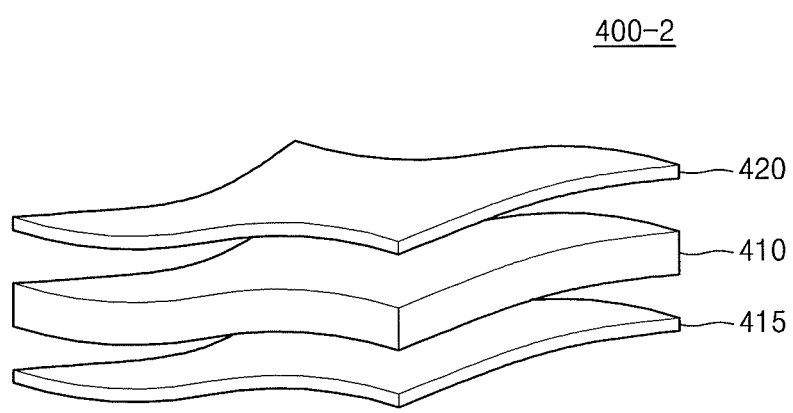
FIG. 3 illustrates an exploded perspective view of a flexible film structure according to an embodiment.

FIG. 3 illustrates an exploded perspective view of a flexible film structure 400-2 according to an embodiment.

The flexible film structure 400-2 of FIG. 3 may be substantially the same as the flexible film structure 400 of FIG. 1 except that the flexible film structure 400-2 may further include a lower functional coating layer 415. In FIG. 3, reference numerals that are the same as those of FIG. 1 denote elements that are the same as those of FIG. 1, and descriptions of the same elements may be omitted or briefly provided for convenience.

The flexible film structure 400-2 may include, e.g., a base film 410, a functional hard coating layer 420 on the base film 410, and a lower functional hard coating layer 415 under the base film 140 (e.g., on an opposite side of the base film 410 relative to the functional hard coating layer 420). The functional hard coating layer 420 may be referred to as an upper functional hard coating layer.

The material and the thickness of the lower functional hard coating layer 415 may be the same as those of the upper functional hard coating layer 420. The flexible film structure 400-2 may be more advantageous in terms of transmissivity or durability by further including the lower functional hard coating layer 415.

Figure 4:
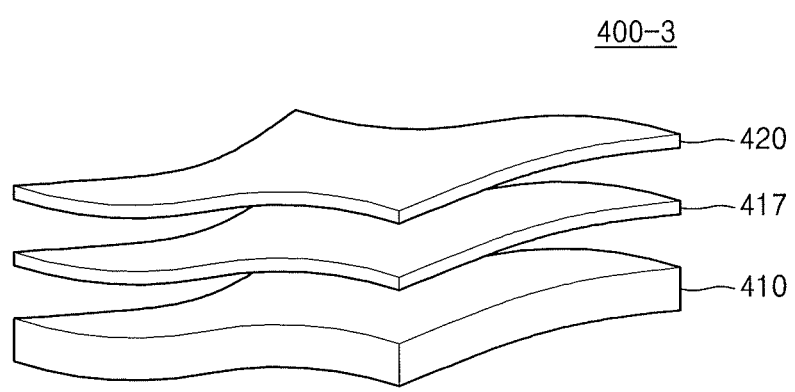
FIG. 4 illustrates an exploded perspective view of a flexible film structure according to an embodiment.

FIG. 4 illustrates an exploded perspective view of a flexible film structure 400-3 according to an embodiment.

The flexible film structure 400-3 of FIG. 4 may be substantially the same as the flexible film structure 400 of FIG. 1 except that the flexible film structure 400-3 may further include a first barrier layer 417. In FIG. 4, reference numerals that are the same as those of FIG. 1 denote elements that are the same as those of FIG. 1, and descriptions of the same elements may be omitted or briefly provided for convenience.

The flexible film structure 400-3 may include, e.g., a base film 410, the first barrier layer 417 on the base film 410, and a functional hard coating layer 420 on the first barrier layer 417.

The first barrier layer 417 may cover an entire upper surface of the base film 410. The first barrier layer 417 may include, e.g., an inorganic layer or an organic layer. In an implementation, the inorganic layer may include, e.g., silicon oxide (SiOx), silicon nitride (SiNx), silicon oxynitride (SiON), aluminum oxide (AlO), or aluminum oxynitride (AlON). In an implementation, the organic layer may include, e.g., acrylic, polyimide, or polyester.

The first barrier layer 417 may block penetration of oxygen or moisture from the outside. The first barrier layer 417 may provide a flat surface above or on the base film 410, and thus, the functional hard coating layer 420 may be easily formed. In an implementation, the first barrier layer 417 may help improve the durability of the flexible film structure 400-3 by improving an adhesive strength between the base film 410 and the functional hard coating layer 420.

The flexible film structure 400-3 may include the first barrier layer 417, the functional hard coating layer 420 may be easily formed, oxygen or moisture from the outside may be blocked, and durability of the flexible film structure 400-3 may be improved. As a result, the flexible film structure 400-3 may be more advantageous in terms of transmissivity or durability by further including the first barrier layer 417.

Figure 5:
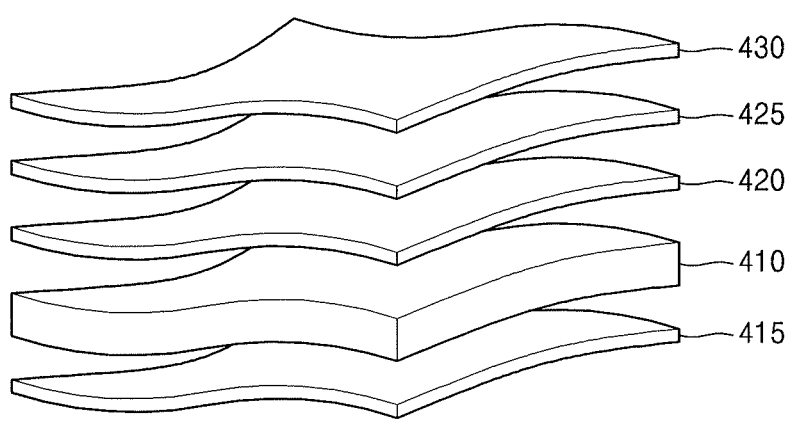
FIG. 5 illustrates an exploded perspective view of a flexible film structure according to an embodiment.

FIG. 5 illustrates an exploded perspective view of a flexible film structure 400-4 according to an embodiment.

The flexible film structure 400-4 of FIG. 5 may be substantially the same as the flexible film structure 400-2 of FIG. 3 except that the flexible film structure 400-4 may further include a second barrier layer 425 and a second functional hard coating layer 430. In FIG. 5, reference numerals that are the same as those of FIGS. 1 and 3 denote elements that are the same as those of FIGS. 1 and 3, and descriptions of the same elements may be omitted or briefly provided for convenience.

The flexible film structure 400-4 may include, e.g., a base film 410, a functional hard coating layer 420 on the base film 410, the second barrier layer 425 on the functional hard coating layer 420, and the second functional hard coating layer 430 on the second barrier layer 425. The flexible film structure 400-4 may also include a lower functional hard coating layer 415, which may be the same as described above. The functional hard coating layer 420 may be referred to as a first functional hard coating layer.

The first functional hard coating layer 420 may include the same material as the second functional hard coating layer 430. The first functional hard coating layer 420 and the second functional hard coating layer 430 may include, e.g., a siloxane polymer having an epoxy group, as described above.

The second barrier layer 425 may include the same material as the first barrier layer 417. The second barrier layer 425 may include the inorganic layer or organic layer described above. The second barrier layer 425 may cover the entire upper surface of the first functional hard coating layer 420.

The second barrier layer 425 may help block penetration of oxygen or moisture from the outside. The second barrier layer 425 may provide a flat surface above the first functional hard coating layer 420, and thus, the second functional hard coating layer 430 may be easily formed. In an implementation, the second barrier layer 425 may help improve durability of the flexible film structure 400-4 by improving an adhesive strength between the first functional hard coating layer 420 and the second functional hard coating layer 430.

The flexible film structure 400-4 includes the second barrier layer 425, the second functional hard coating layer 430 may be easily formed, oxygen or moisture from the outside may be blocked, and durability of the flexible film structure 400-4 may be improved. As a result, the flexible film structure 400-4 may be more advantageous in terms of transmissivity or durability by further including the second barrier layer 425.

Figure 6:
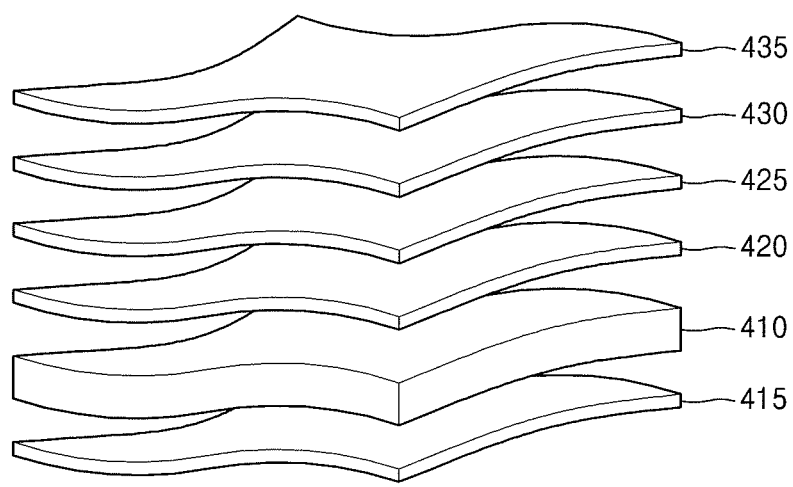
FIG. 6 illustrates an exploded perspective view of a flexible film structure according to an embodiment.

FIG. 6 illustrates an exploded perspective view of a flexible film structure 400-5 according to an embodiment.

The flexible film structure 400-5 of FIG. 6 may be substantially the same as the flexible film structure 400-4 of FIG. 5 except that the flexible film structure 400-5 may further include a transparent electrode layer 435. In FIG. 6, reference numerals that are the same as those of FIGS. 1 and 5 denote elements that are the same as those of FIGS. 1 and 5, and descriptions of the same elements may be omitted or briefly provided for convenience.

The flexible film structure 400-5 may include a base film 410, a first functional hard coating layer 420 formed on the base film 410, a second barrier layer 425 formed on the first functional hard coating layer 420, a second functional hard coating layer 430 formed on the second barrier layer 425, and the transparent electrode layer 435 formed on the second functional hard coating layer 430. The flexible film structure 400-5 may also include a lower functional hard coating layer 415, which may be the same as described above.

The transparent electrode layer 435 may include a transparent electrode pattern. In an implementation, the transparent electrode pattern may include, e.g., indium tin oxide (ITO), indium zinc oxide (IZO), zinc oxide (ZnO), indium oxide ($In_2O_3$), indium gallium oxide (IGO), or aluminum zinc oxide (AZO), which have a high work function The transparent electrode layer 435 may be a layer to which an electrical signal is applied to implement various functions when the flexible film structure 400-5 is used in a flexible display device, as described below. For example, the transparent electrode layer 435 may be used as an electrode layer of a touch screen panel of a flexible display device.

The flexible film structure 400-5 may be advantageous in terms of transmissivity or durability by including the transparent electrode layer 435, and may also implement various functions in a flexible display device.

Figure 7A:
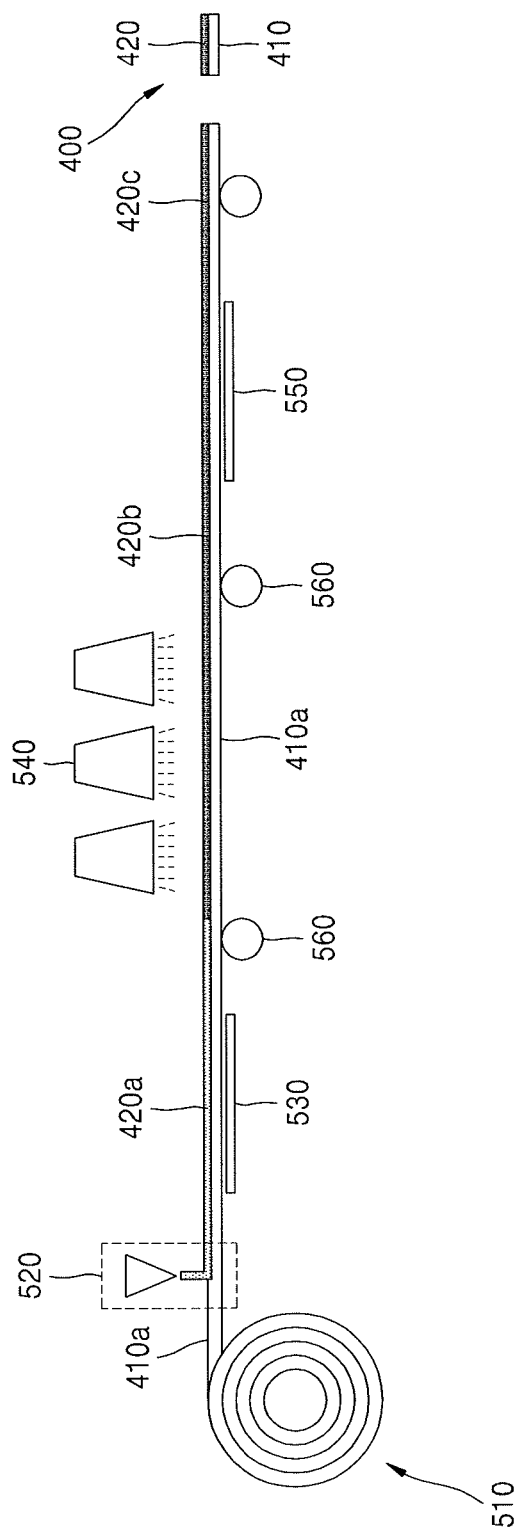
FIGS. 7A and 7B illustrate diagrams for explaining a method of manufacturing a flexible film structure, according to an embodiment.
Figure 7B:
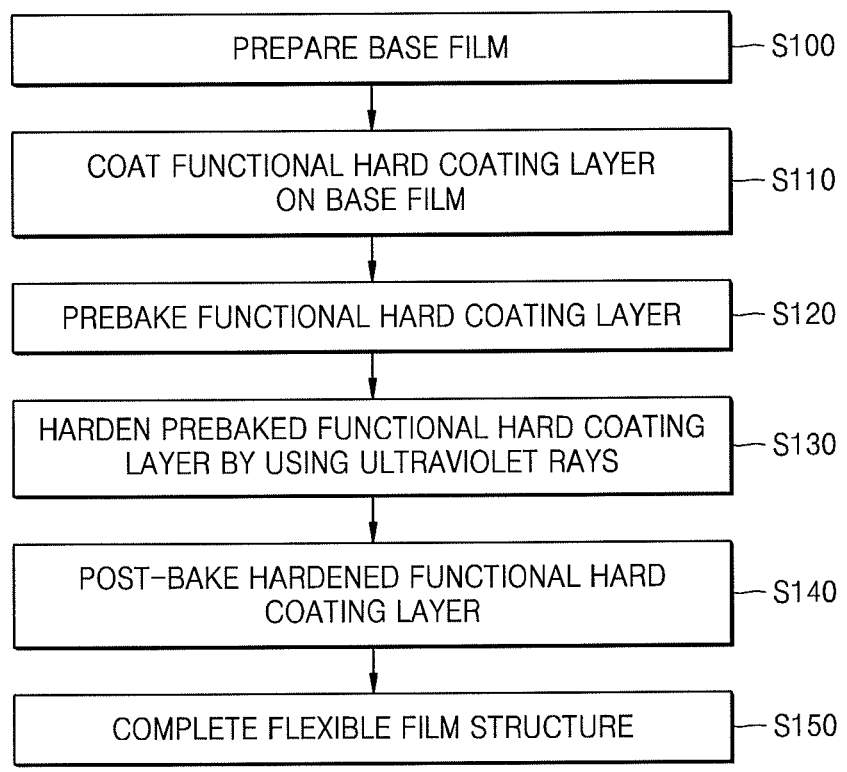

FIGS. 7A and 7B illustrate diagrams for explaining a method of manufacturing a flexible film structure, according to an embodiment.

FIG. 7A illustrates a diagram of a manufacturing system that performs the method of manufacturing a flexible film structure, and FIG. 7B illustrates a flowchart for explaining the method of manufacturing a flexible film structure. With reference to FIGS. 7A and 7B, a method of manufacturing the flexible film structure 400 of FIG. 1 is explained for convenience.

The method of manufacturing a flexible film structure may include preparing a base film 410a (operation S100). The base film 410a may be, e.g., a glass film, a plastic film, or a metal film, as described above. The base film 410a may be rolled up on a winder apparatus 510.

The base film 410a may be unrolled from the winder apparatus 510 and provided on a coater 520 via a roller 560. The coater 520 may be a slot die coater. A functional hard coating layer 420a (including, e.g., siloxane polymer having an epoxy group) may be coated on the base film 410a provided to the coater 520 (operation S110). In an implementation, the functional hard coating layer 420a may include an organic solvent, and thus may be a layer including a transparent liquid material.

The method of manufacturing a flexible film structure may include prebaking the functional hard coating layer 420a (operation S120). The prebaking may be performed in a prebake device 530. The prebaking may be performed, e.g., for about 1 to 2 minutes at temperature of about 60° C. to 120° C. The organic solvent may be evaporated through the prebaking.

The method of manufacturing a flexible film structure may include hardening the prebaked functional hard coating layer 420a (operation S130). The prebaked functional hard coating layer 420a may be moved to an ultraviolet irradiation device 540 by using the roller 560. The prebaked functional hard coating layer 420a may be hardened or sintered by irradiating ultraviolet rays on the prebaked functional hard coating layer 420a by using the ultraviolet irradiation device 540.

In an implementation, the ultraviolet irradiation by the ultraviolet irradiation device 540 may be performed for about 1 to 2 minutes. In an implementation, the ultraviolet irradiation may be performed with pulse-type ultraviolet rays. Pulse-type ultraviolet irradiation may be a method in which ultraviolet rays are irradiated in an on-off manner. For example, the pulse-type ultraviolet irradiation may be a method that repeatedly performs an operation in which ultraviolet rays are not irradiated for 2 seconds after the ultraviolet rays are irradiated for 1 second.

The method of manufacturing a flexible film structure may include post-baking the hardened functional hard coating layer 420b (operation S140). The hardened functional hard coating layer 420b may be moved to a post-bake device 550 by using the roller 560. The hardened functional hard coating layer 420b may be post-baked by using the post-bake device 550.

The post-baking may be performed, e.g., for about 15 to 20 minutes at temperature of about 60° C. to 120° C. The pencil hardness of the hardened functional hard coating layer 420b may be increased by aging the hardened functional hard coating layer 420b in addition to removing the remaining organic solvent through the post-baking.

The method of manufacturing a flexible film structure may include completing the flexible film structure 400 by cutting the base film 410a and post-baked functional hard coating layer 420c (operation S150). When the base film 410a and the post-baked functional hard coating layer 420c are cut, the flexible film structure 400 that includes the base film 410 and the functional hard coating layer 420 and is fixed in size may be obtained as shown in FIG. 1.

Figure 8A:
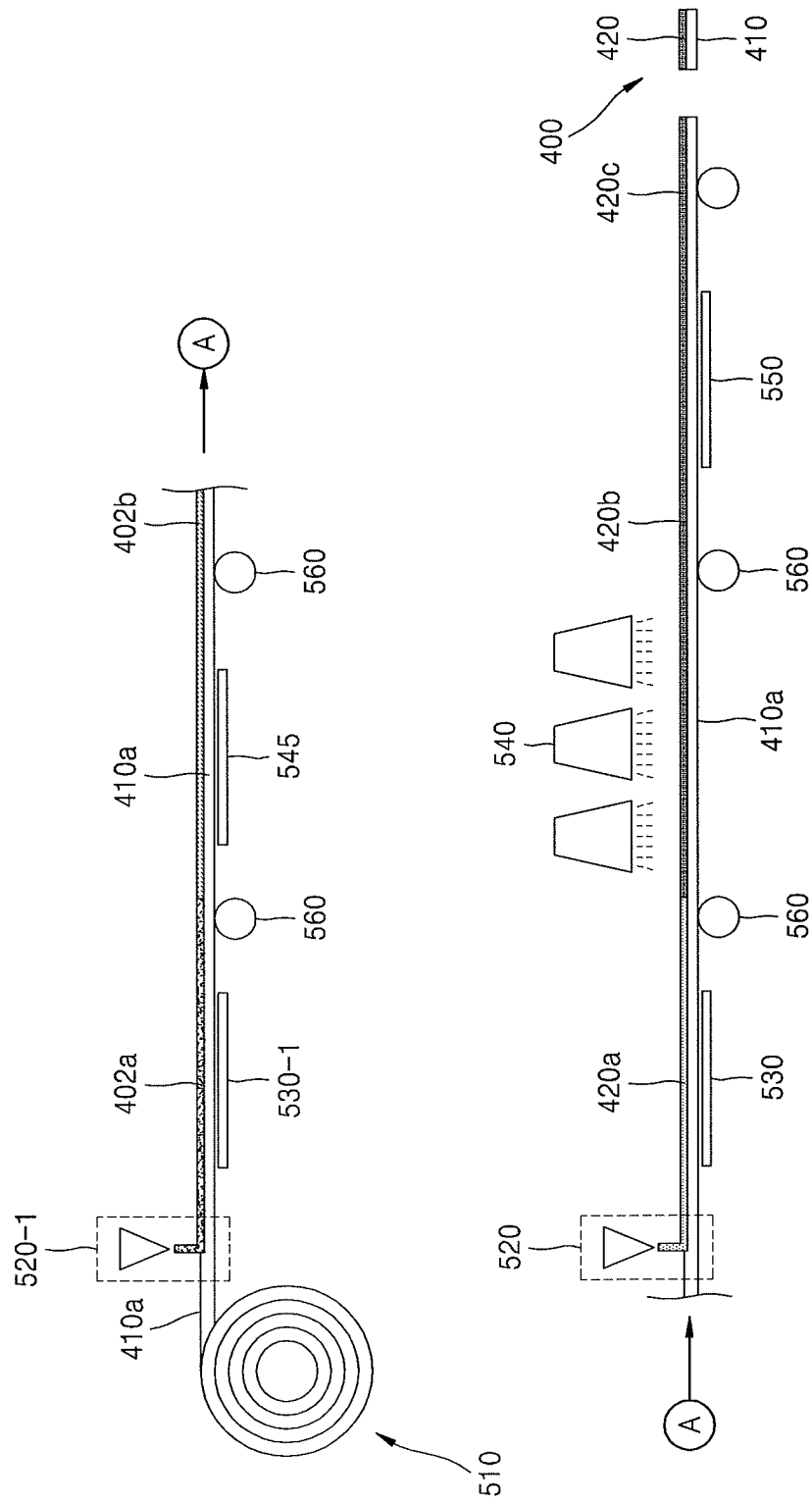
FIGS. 8A and 8B illustrate diagrams for explaining a method of manufacturing a flexible film structure, according to an embodiment.
Figure 8B:
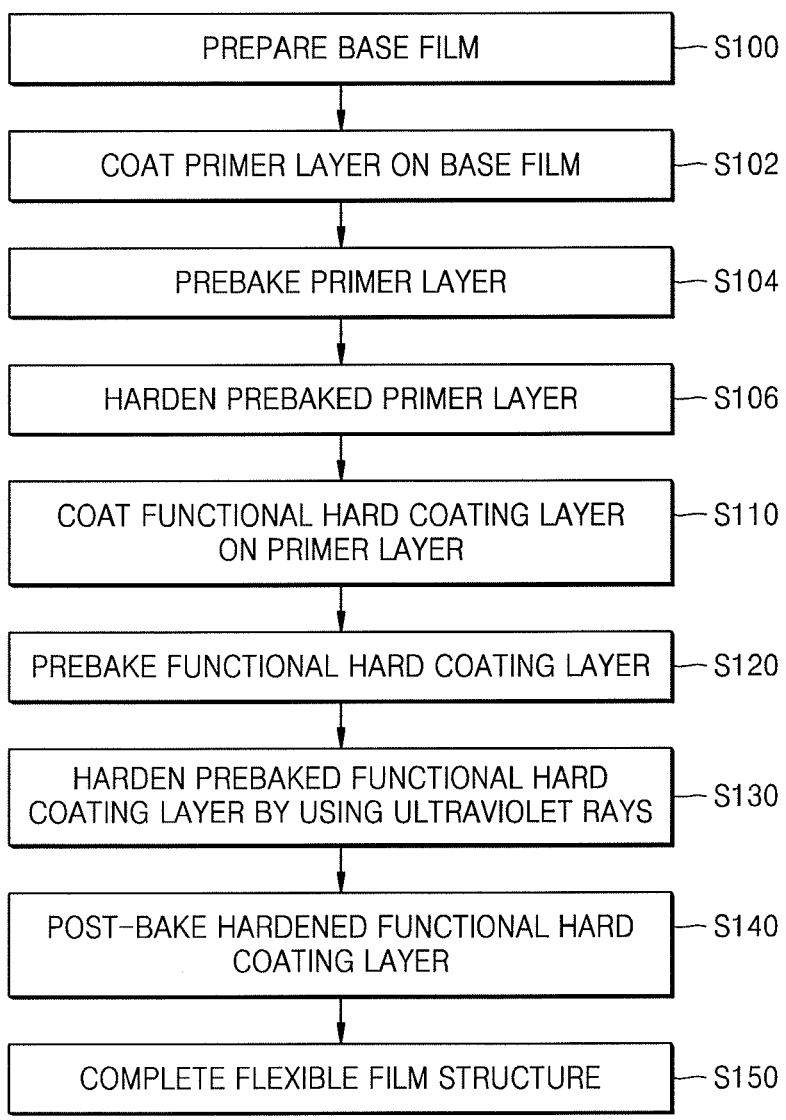

FIGS. 8A and 8B illustrate diagrams for explaining a method of manufacturing a flexible film structure, according to an embodiment.

FIG. 8A illustrates a diagram of a manufacturing system that performs the method of manufacturing a flexible film structure. FIG. 8B illustrates a flowchart for explaining the method of manufacturing a flexible film structure. With reference to FIGS. 8A and 8B, a method of manufacturing the flexible film structure 400 of FIG. 1 is explained for convenience.

The method of FIG. 8B may be substantially the same as that of FIG. 7B except that the method of FIG. 8B may further include forming a primer layer (operations S102 to S106). The manufacturing system of FIG. 8A may be substantially the same as that of FIG. 7A except that the manufacturing system of FIG. 8A may further include a primer coater 520-1, a prebake device 530-1, and a heat hardening device 545 in front of the coater 520. In FIGS. 8A and 8B, reference numerals that are the same as those of FIGS. 7A and 7B denote elements that are the same as those of FIGS. 7A and 7B, and thus, descriptions of the same elements may be omitted or briefly provided for convenience.

The method of manufacturing a flexible film structure may include preparing a base film 410a of FIG. 7 (operation S100), as described above. The base film 410a may be unrolled from a winder apparatus 510 and provided to a coater 520-1 via a roller 560. The coater 520-1 may be a slot die coater.

The method of manufacturing a flexible film structure may include coating a primer layer 402a on the base film 410a (operation S102). The primer layer 402a may include a siloxane polymer having an epoxy group, and may be coated on the base film 410a that is provided to the coater 520-1 (operation S102).

The primer layer 402a may include an organic solvent, and thus may be a layer including a transparent liquid material. The primer layer 402a may help improve an adhesive strength between the base film 410a and a functional hard coating layer 420a to be formed later. In an implementation, the primer layer 402a may include the same material as the functional hard coating layer 420a.

The method of manufacturing a flexible film structure may include prebaking the primer layer 402a (operation S104). The prebaking may be performed in a prebake device 530-1. The prebaking may be performed, e.g., for about 1 to 2 minutes at temperature of about 60° C. to 120° C. The organic solvent may be evaporated through the prebaking.

The method of manufacturing a flexible film structure may include hardening the prebaked primer layer 402a (operation S106). The prebaked primer layer 402a may be moved to the heat hardening device 545 by using the roller 560. The prebaked primer layer 402a may be hardened or sintered by applying heat to the prebaked primer layer 402a. The heat hardening may be performed, e.g., for about 1 to 2 minutes at temperature of about 60° C. to 120° C. The prebaked primer layer 402a may be changed to a hardened primer layer 402b due to the heat hardening.

The method of manufacturing a flexible film structure includes forming the functional hard coating layer 420a on the hardened primer layer 402b (operation S110). The hardened primer layer 402b may be thin and combined with the functional hard coating layer 420a, and the hardened primer layer 402b is not illustrated in FIG. 8A for convenience.

Next, prebaking the functional hard coating layer 420a described above with reference to FIGS. 7A and 7B may be performed (operation S120). Forming the functional hard coating layer 420a (operation S110) to complete formation the flexible film structure 400 (operation S150) have been described above in detail with reference to FIGS. 7A and 7B, descriptions thereof are omitted.

Figure 9:
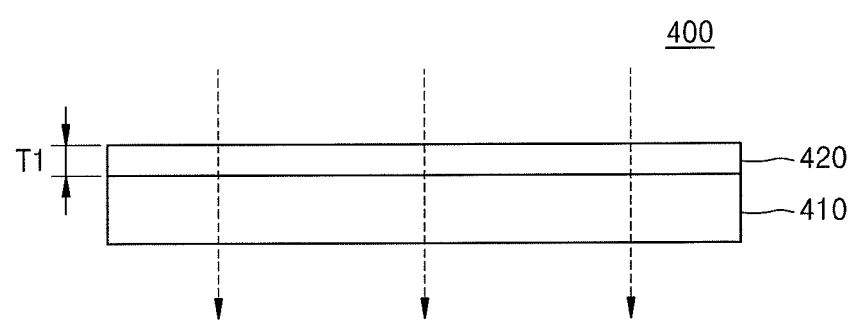
FIG. 9 illustrates a cross-sectional view of a flexible film structure according to an embodiment.
Figure 10:
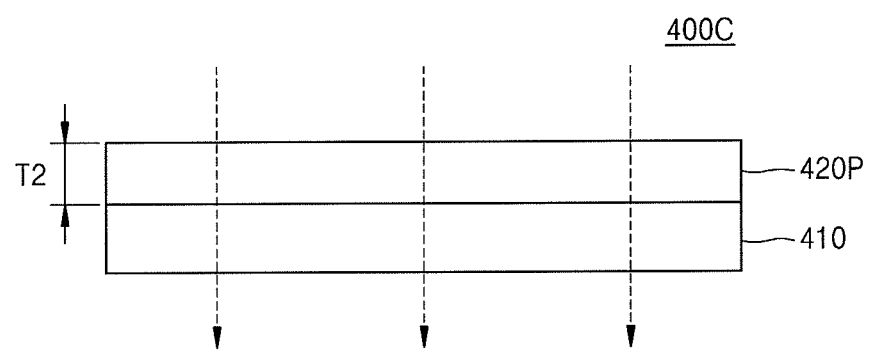
FIG. 10 illustrates a cross-sectional view of a flexible film structure according to a comparison example with respect to FIG. 9.

FIG. 9 illustrates a cross-sectional view of a flexible film structure 400 according to an embodiment. FIG. 10 illustrates a cross-sectional view of a flexible film structure 400C according to a comparison example for comparison with FIG. 9.

The flexible film structure 400 shown in FIG. 9 may include the base film 410 and the functional hard coating layer 420 on the base film 410. The functional hard coating layer 420 may include a siloxane polymer having an epoxy group.

In an implementation, the thickness of the base film 410 may be less than about 100 μm, e.g., about 50 μm to 100 μm. The thickness of the functional hard coating layer 420 may be T1, e.g., about 1 μm to about 30 μm. In an implementation, when the thickness of the functional hard coating layer 420 is about 30 μm, the pencil hardness of the functional hard coating layer 420 may be about 8H. In FIG. 9, the flexible film structure 400 of FIG. 1 is illustrated as an example for convenience.

The flexible film structure 400C shown in FIG. 10 may include a base film 410 and a hard coating layer 420P formed on the base film 410. The hard coating layer 420P may include a general purpose polymer, e.g., melamine or acrylic. The thickness of the base film 410 may be the same as that of the embodiment described above. The thickness of the hard coating layer 420P may be T2, e.g., about 50 μm.

The thickness of the hard coating layer 420P may be larger than that of the functional hard coating layer 420 of the embodiment of FIG. 9. When the thickness of the hard coating layer 420P is about 50 μm, the pencil hardness of the hard coating layer 420P may be about 7H to 8H.

Although the functional hard coating layer 420 of the embodiment is thin compared to the hard coating layer 420P of the comparison example, the functional hard coating layer 420 of the embodiment may still achieve a relatively high pencil hardness. In FIGS. 9 and 10, light may pass through the flexible film structures 400 and 400C from the upper side of the flexible film structures 400 and 400C to the lower side of the flexible film structures 400 and 400C. Light may pass through the flexible film structures 400 and 400C from the lower side of the flexible film structures 400 and 400C to the upper side of the flexible film structures 400 and 400C.

FIG. 11 illustrates a table showing the pencil hardness of a flexible film structure according to an embodiment.

FIG. 11 shows the pencil hardness of the functional hard coating layer 420 forming the flexible film structure 400 illustrated in FIG. 9. For example, as the thickness of the functional hard coating layer 420 increases from about 1 μm to about 30 μm, the pencil hardness of the functional hard coating layer 420 may increase from about 2H to about 8H.

In an implementation, the thickness of the functional hard coating layer 420 may be adjusted from about 1 μm to about 30 μm depending on a desired hardness level. When a pencil hardness of about 4H to 8H is desired, the thickness of the functional hard coating layer 420 may be adjusted to about 5 μm to 30 μm.

As a comparison example, when the thickness of the base film 410 of FIG. 9 is less than about 100 μM, the pencil hardness thereof may be about 5B. Accordingly, the functional hard coating layer 420 may be included on the base film 410 to help increase the pencil hardness thereof.

Figure 12:
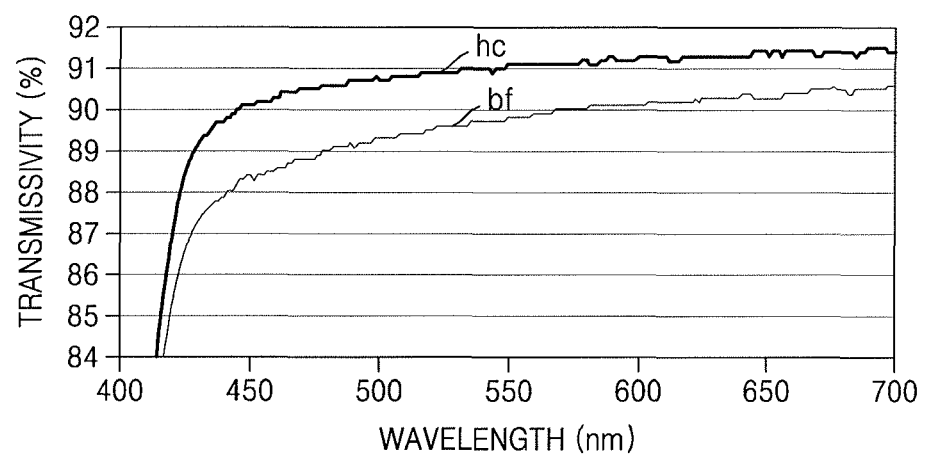
FIG. 12 illustrates a graph showing the transmissivity of a flexible film structure according to an embodiment.

FIG. 12 illustrates a graph showing the transmissivity of a flexible film structure according to an embodiment.

For example, a reference mark "hc" of FIG. 12 indicates the transmissivity of the flexible film structure 400 according to the embodiment described above. In a sample used to measure the transmissivity of the flexible film structure 400, the thickness of a base film may be less than about 100 μm, e.g., about 50 μm to 100 μm, and the thickness of a functional hard coating layer may be about 5 μm to 30 μm.

As indicated by the reference mark "hc", the transmissivity of the flexible film structure 400 according to an embodiment may be about 90% to 92% in a visible band (in which an optical wavelength is about 450 nm to 700 nm). For example, as indicated by the reference mark "hc", the transmissivity of the flexible film structure 400 according to an embodiment may be about 91% in a visible band in which an optical wavelength is about 550 nm. The transmissivity of the flexible film structure 400 may be similar to the transmissivity of a glass, which is about 91% to 92%.

A reference mark "bf" of FIG. 12 indicates the transmissivity of a base film or the flexible film structure 400C of the comparison example shown in FIG. 10. The transmissivity of the base film or the flexible film structure 400C of the comparison example may be about 90% in a visible band in which an optical wavelength is about 550 nm. Thus, the transmissivity of the flexible film structure 400 according to the embodiment may be higher than that of the base film or the flexible film structure 400C of the comparison example.

Hereinafter, a flexible display device using the flexible film structure described above is described. The flexible display device that is described below may have a changeable form that may be folded or rolled, and may be implemented in various forms, such as a smart phone, a tablet personal computer (PC), a notebook, a wearable device, an e-book, and the like.

Hereinafter, a light-emitting display device is described as the flexible display device using the flexible film structure described above. In an implementation, the flexible display device using the flexible film structure may also be applied to a liquid crystal display device, a field emission display device, or an electronic paper display device.

Figure 13:
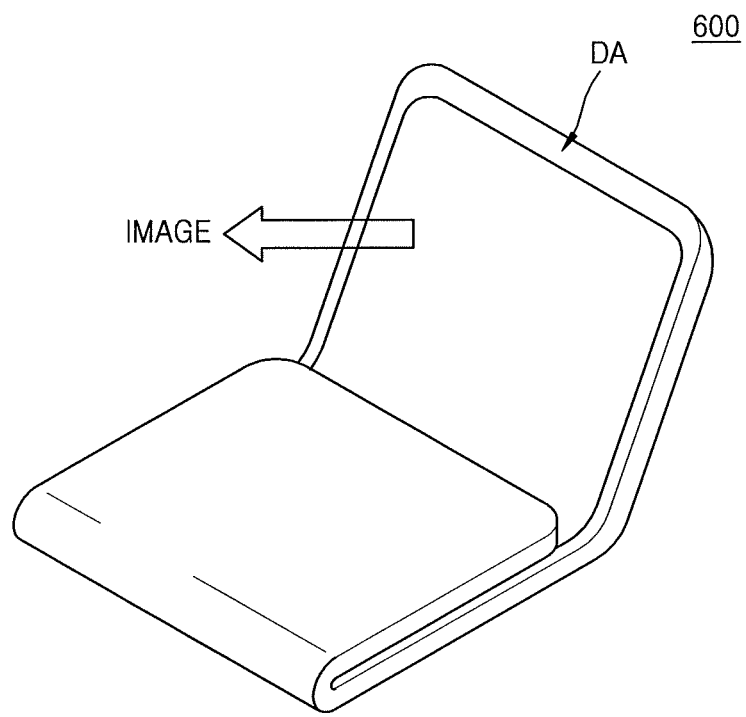
FIG. 13 illustrates a perspective view of a flexible display device according to an embodiment.

FIG. 13 illustrates a perspective view of a flexible display device 600 according to an embodiment.

For example, the flexible display device 600 may have properties that it may be folded, in addition to flexible properties that it may be bent. Due to such properties, a user may easily carry the flexible display device 600 by folding it to reduce the volume or footprint thereof and may easily use the flexible display device 600 after unfolding it.

The flexible display device 600 may include a display area DA on which an image is displayed. The display area DA may be folded so that two parts of the display area DA face each other. FIG. 13 shows an example in which the flexible display device 600 is folded once. In an implementation, the flexible display device 600 may be folded two times or more. A direction and a form, in which the flexible display device 600 is folded may be variously implemented.

Figure 14A:
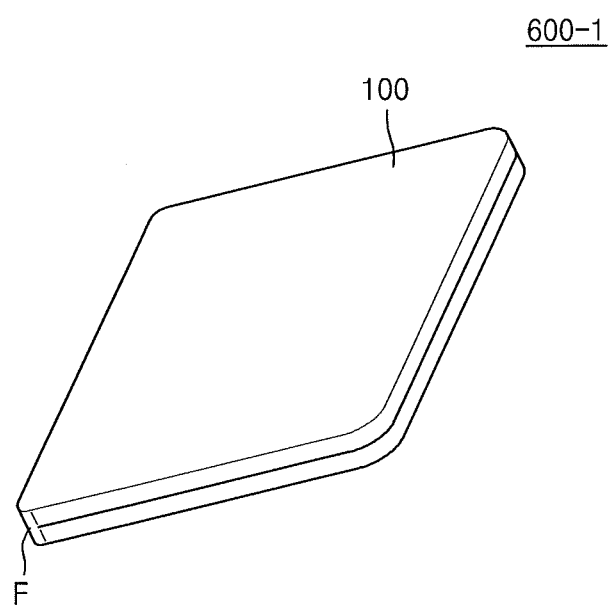
FIGS. 14A and 14B illustrate perspective views of a flexible display device according to an embodiment.
Figure 14B:
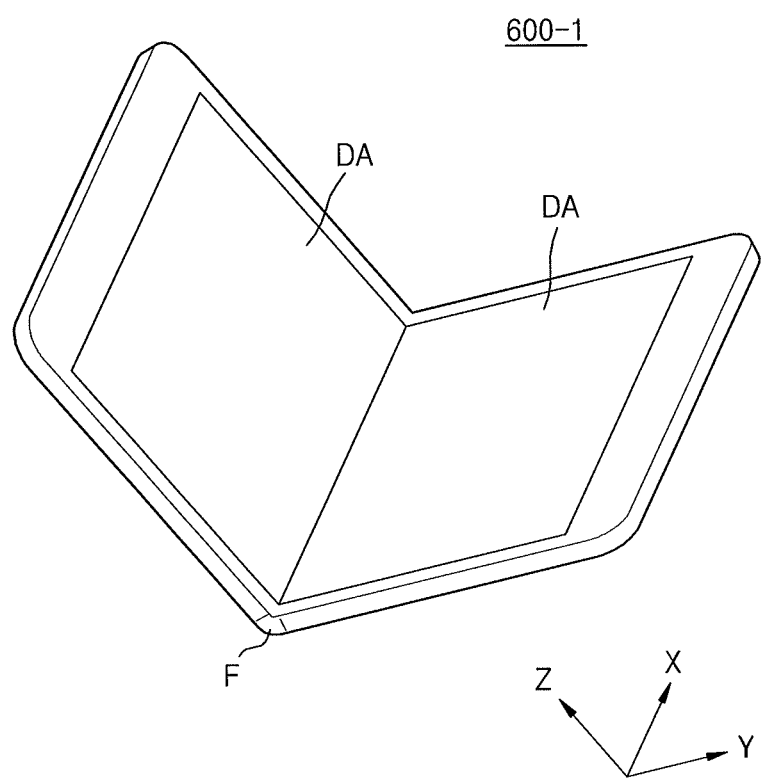

FIGS. 14A and 14B illustrate perspective views of a flexible display device 600-1 according to an embodiment.

For example, the form of the flexible display device 600-1 may be changed to a folded state as shown in FIG. 14A or an unfolded state as shown in FIG. 14B. The folded state may include a state in which the flexible display device 600-1 is bent, and may include a state in which surfaces, which face each other when the flexible display device 600-1 is folded based on a folding area F, do not contact each other and are close to each other, as well as a state in which the surfaces contact each other.

The flexible display device 600-1 may change a screen depending on the folded state or the unfolded state. For example, when the flexible display device 600-1 is in the unfolded state, an image may be implemented in the display area DA.

Figure 15A:
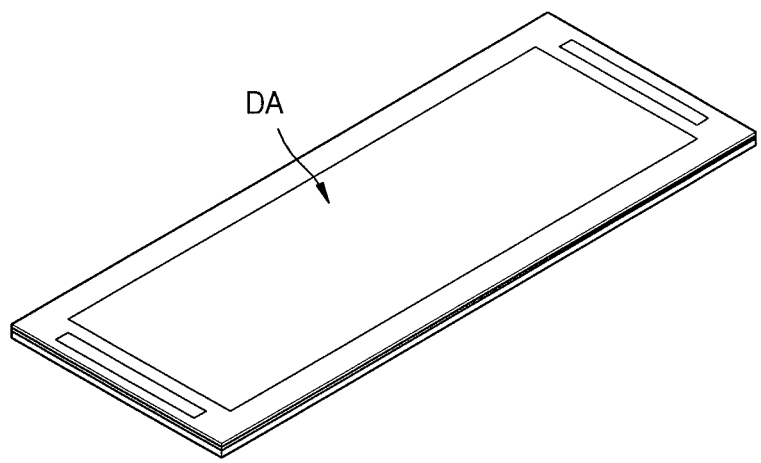
FIGS. 15A and 15B illustrate perspective views of a flexible display device according to an embodiment.
Figure 15B:
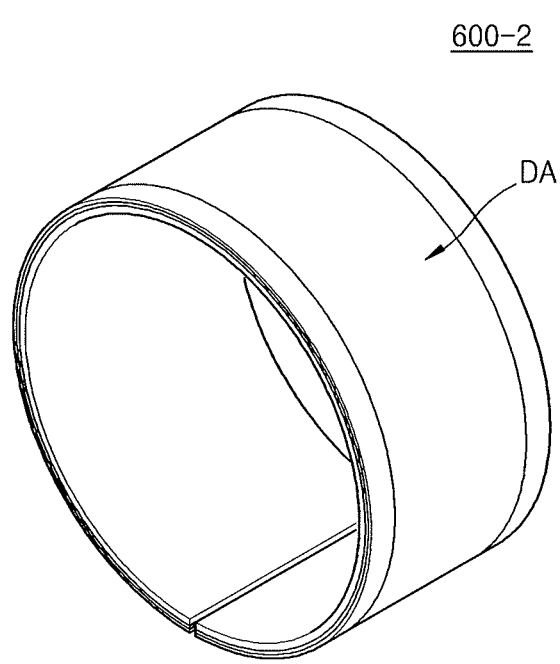

FIGS. 15A and 15B are perspective views of a flexible display device 600-2 according to an embodiment.

For example, FIG. 15A shows a state in which the flexible display device 600-2 is unfolded and FIG. 15B shows a state in which the flexible display device 600-2 is curved in a circular shape.

The flexible display device 600-2 may allow a user to enjoy an image at various angles, e.g., in the folded state or the unfolded state, depending on the desires of the user. In FIG. 15B, a display area DA is illustrated on the outer surface of the flexible display device 600-2. In an implementation, the display area DA may be on the inner surface of the flexible display device 600-2. This may be determined depending on a direction in which the flexible display device 600-2 is bent.

Figure 16:
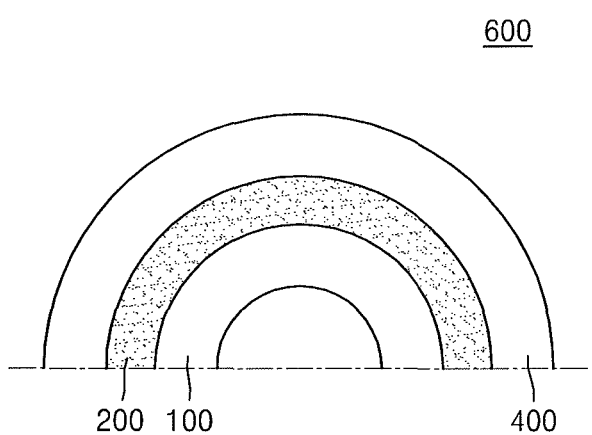
FIGS. 16 and 17 illustrate cross-sectional views of a flexible display device according to an embodiment.
Figure 17:
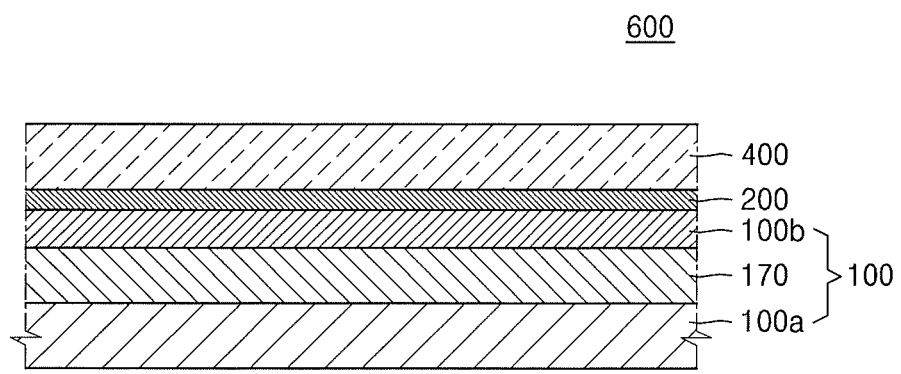

FIGS. 16 and 17 illustrate cross-sectional views of a flexible display device 600 according to an embodiment.

For example, the flexible display device 600 may include a flexible display panel 100, a touch screen panel 200, and a window cover 400.

FIG. 16 shows an example in which the flexible display device 600 is bent in an elliptical shape. FIG. 17 shows a cross section of the flexible display device 600. The flexible display panel 100 may include a flexible display substrate 100a, an intermediate member 170 (including a thin film transistor and an organic light-emitting device), and an encapsulation layer 100b.

A flexible structure according to an embodiment described above may be used as the window cover 400. The window cover 400 shown in FIGS. 16 and 17 is a representative window cover of the embodiments described above.

Figure 18:
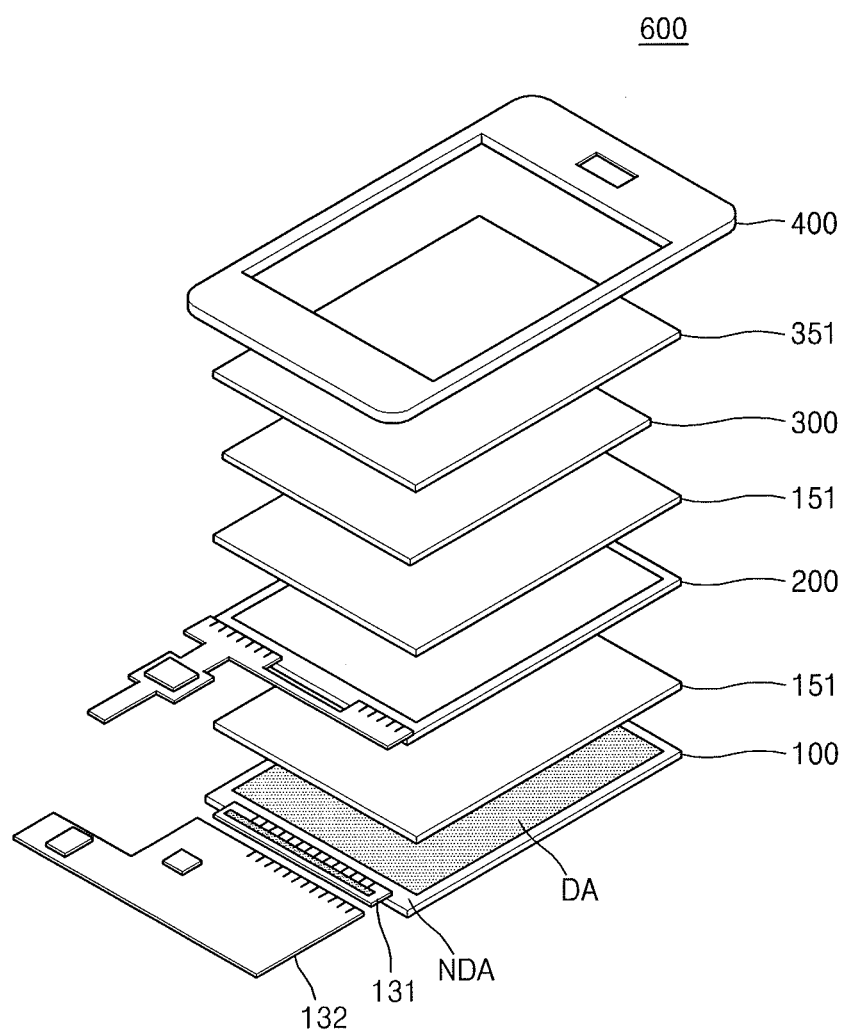
FIG. 18 illustrates an exploded perspective view of a stack structure of the flexible display device of FIGS. 16 and 17.

FIG. 18 illustrates an exploded perspective view of a stack structure of the flexible display device 600 of FIGS. 16 and 17.

For example, the flexible display device 600 may include, in a sequential order from a bottom side thereof to an uppermost side thereof whereon a displayed image is seen by a user, a flexible display panel 100, a touch screen panel 200, an optical film 300, and a window cover 400. In an implementation, the optical film 300 may be omitted if desired.

The flexible display panel 100 is a device for displaying an image and has flexible properties that it may be folded. One surface of the flexible display panel 100 may include a display area DA in which an image is displayed. A plurality of pixels are placed in the display area DA, and the entire display area DA may implement an image as each of the pixels emits light. The display area DA is described below in more detail with reference to FIG. 19.

A non-display area NDA is placed around the display area DA, a plurality of pads are placed in the non-display area NDA, and the plurality of pads are connected to wiring lines extending from the display area DA. Chips for applying various signals to the display area DA may be placed in the plurality of pads. As shown in FIG. 18, the chips may be placed by using a method in which a bare chip is mounted on and connected to a flexible substrate by using a chip-on-film (COF) 131.

The flexible display device 600 may further include a wiring board 132 to apply various power voltages to the chips. The wiring board 132 may be electrically connected to the chips. For example, the wiring board 132 may be a flexible printed circuit board (FPCB). The FPCB may electrically connect other elements of the flexible display device 600, for example, the touch screen panel 200 and the flexible display panel 100.

The touch screen panel 200 is provided on the flexible display panel 100. One surface of the flexible display panel 100, from which light is emitted, and a back surface of the touch screen panel 200 may be bonded to each other by an adhesive 151. The touch screen panel 200 is electrically connected to the flexible display panel 100.

The optical film 300 may be provided on the touch screen panel 200. An upper surface of the touch screen panel 200 and a back surface of the optical film 300 may be bonded to each other by the adhesive 151. The optical film 300 may be a circular polarization film, a polarization film, or the like, and may help prevent the reflection of external light to allow a user to easily observe an image.

The window cover 400 may be provided on the optical film 300 by using a flexible film structure according to any of the embodiments, as described above. An upper surface of the optical film 300 and a back surface of the window cover 400 may be bonded to each other by an adhesive layer 351. The adhesive layer 351 may have a thickness of tens of micrometers, e.g., about 30 to 70 μm. The adhesive layer 351 may include a soft material having elasticity, for example, a silicon-based elastomer.

Figure 19:
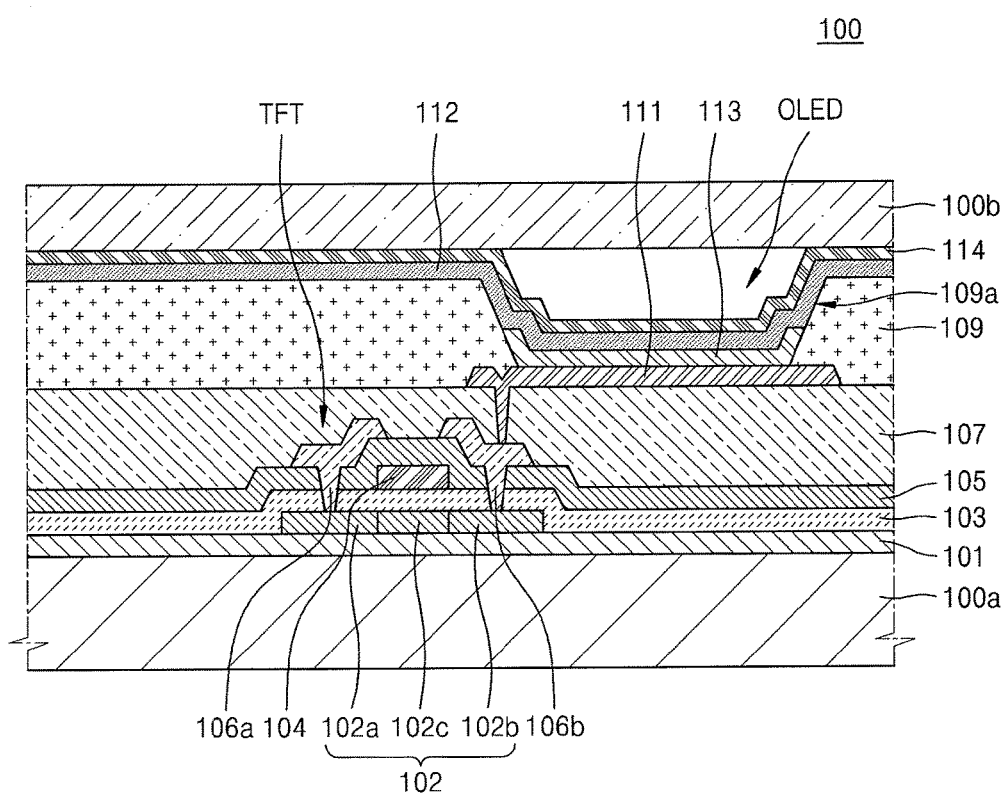
FIG. 19 illustrates a cross-sectional view of a display area of the flexible display panel shown in FIG. 18.

FIG. 19 illustrates a cross-sectional view of the display area DA of the flexible display panel 100 shown in FIG. 18.

For example, a detailed structure of the display area DA and a method of manufacturing the flexible display panel 100 are described together. First, a flexible display substrate 100a is prepared. The flexible display substrate 100a includes a flexible material that may be bent or folded. For example, the flexible display substrate 100a may include a plastic film such as a polyimide film or may include a thin sheet glass, a thin metal film, or the like.

A buffer layer 101 may be formed on the flexible display substrate 100a. The buffer layer 101 may help smooth an upper surface of the flexible display substrate 100a and may help block the penetration of impurities. The buffer layer 101 may be referred to as a barrier layer. The buffer layer 101 may include a multi-layer or single layer including an inorganic material, e.g., silicon oxide (SiOx) and/or silicon nitride (SiNx), and may be formed by using any one of various deposition methods. In an implementation, the buffer layer 101 may be omitted.

A pixel circuit portion is formed on the buffer layer 101. The pixel circuit portion may include at least one thin film transistor TFT. In an implementation, the pixel circuit portion may further include at least one capacitor. For convenience of description, only one thin film transistor TFT corresponding to one pixel is illustrated in FIG. 19. In an implementation, a pixel circuit corresponding to one pixel may include at least two thin film transistors TFT and at least one capacitor. The thin film transistor TFT shown in FIG. 19 is a top gate type and sequentially includes an active layer 102, a gate electrode 104, and source/drain electrodes 106a and 106b from the flexible display substrate 100a. In an implementation, a thin film transistor TFT of any of various types, such as a bottom gate type and the like, may be adopted.

The active layer 102 is formed on the buffer layer 101. The active layer 102 may include a semiconductor material, e.g., amorphous silicon or poly crystalline silicon. In an implementation, the active layer 102 may include an oxide semiconductor material, e.g., G-I-Z-O[$(In_2O_3)_a(Ga_2O_3)_b(ZnO)_c$] (where a, b, and c are real numbers that satisfy conditions of a≥0, b≥0, and c>0, respectively). The active layer 102 may include an oxide of a material selected from group 12, 13, or 14-based metal elements, such as zinc (Zn), indium (In), gallium (Ga), tin (Sn), cadmium (Cd), germanium (Ge), and hafnium (Hf), and a combination thereof, in addition to the G-I-Z-O. The active layer 102 includes a source region 102a and a drain region 102b which contact the source electrode 106a and the drain electrode 106b, respectively, and a channel region 102c that is between the source region 102a and the drain region 102b. When the active layer 102 includes amorphous silicon or poly crystalline silicon, the source region 102a and the drain region 102b may be doped with impurities as desired.

A gate insulating layer 103 is formed on the active layer 102, and may include a multi-layer or single layer including an inorganic material, such as SiOx and/or SiNx. The gate insulating layer 103 insulates the gate electrode 104 from the active layer 102.

The gate electrode 104 is formed on the gate insulating layer 103. The gate electrode 104 is connected to a gate line that applies an on/off signal to the thin film transistor TFT. The gate electrode 104 may include a low-resistance metal material, and may include a multi-layer or single layer that includes a conductive material including, e.g., molybdenum (Mo), aluminum (Al), copper (Cu), or titanium (Ti).

An interlayer dielectric layer 105 is formed on the gate electrode 104. The interlayer dielectric layer 105 insulates the gate electrode 104 from the source electrode 106a and the drain electrode 106b. The interlayer dielectric layer 105 may include a multi-layer or single layer including an inorganic material. In an implementation, the inorganic material may be metal oxide or metal nitride, e.g., the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The source electrode 106a and the drain electrode 106b are formed on the interlayer dielectric layer 105. For example, the source electrode 106a and the drain electrode 106b may include a multi-layer or single layer that includes a conductive material including Mo, Al, Cu, or Ti. The source electrode 106a and the drain electrode 106b contact the source region 102a and the drain region 102b, respectively, via contact holes formed in the interlayer dielectric layer 105 and the gate insulating layer 103.

Next, a planarization layer 107 is formed to cover the thin film transistor TFT. The planarization layer 107 reduces a step difference caused by the thin film transistor TFT and flattens an upper surface to prevent a defect from occurring in an organic light-emitting device OLED due to a lower unevenness. The planarization layer 107 may include a multi-layer or single layer that includes an inorganic material and/or an organic material. In an implementation, the inorganic material may be metal oxide or metal nitride, e.g., the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The organic material may include a general purpose polymer, such as polymethylmethacrylate (PMMA) or polystyrene (PS), a polymer derivative having a phenol group, an acrylic polymer, an imide polymer, an aryl ether polymer, an amide polymer, a fluorine-based polymer, a p-xylene-based polymers, a polyvinyl alcohol polymer, or a blend thereof. The planarization layer 107 may include a complex stack structure including an inorganic insulating layer and an organic insulating layer.

The thin film transistor TFT is connected to the organic light-emitting device OLED. The organic light-emitting device OLED emits or does not emit light depending on the turn-on or turn-off of the thin film transistor TFT. FIG. 19 illustrates an example in which the flexible display panel 100 is driven in an active manner. In an implementation, the current embodiment may also be applied to passive manner-based driving that does not need a thin film transistor TFT. In this case, a layer in which a thin film transistor array has been formed may be omitted.

The organic light-emitting device OLED is formed on the planarization layer 107. For example, the organic light-emitting device OLED may include a pixel electrode 111, an opposite electrode 112 that is opposite to the pixel electrode 111, and an intermediate layer 113 that is interposed between the pixel electrode 111 and the opposite electrode 112. Display devices are classified into a bottom emission type, a top emission type, and a dual emission type depending on an emission direction of the organic light-emitting device OLED. In the bottom emission type, the pixel electrode 111 is provided as a light transmission electrode, and the opposite electrode 112 is provided as a reflective electrode. In the top emission type, the pixel electrode 111 is provided as a reflective electrode, and the opposite electrode 112 is provided as a semi-transmission electrode. In the dual emission type, both the pixel electrode 111 and the opposite electrode 112 are provided as light transmission electrodes. FIG. 19 illustrates an example in which an organic light-emitting display device including the flexible display panel 100 is the top emission type.

The pixel electrode 111 may be patterned in an island form corresponding to each pixel. Also, the pixel electrode 111 contacts the thin film transistor TFT of the pixel circuit portion via a hole of the planarization layer 107. Although not shown in FIG. 19, the pixel electrode 111 may be disposed to overlap the thin film transistor TFT to cover the pixel circuit portion under the pixel electrode 111.

The pixel electrode 111 may include a reflective electrode layer as well as a transparent electrode layer to enable the reflection of light in the direction of the opposite electrode 112. When the pixel electrode 111 functions as an anode, the transparent electrode layer may include at least one selected from the group including transparent conductive oxide materials, such as indium tin oxide (ITO), indium zinc oxide (IZO), zinc oxide (ZnO), indium oxide ($In_2O_3$), indium gallium oxide (IGO), and aluminum zinc oxide (AZO), which have a high work function. In an implementation, the reflective electrode layer may include a metal having high reflexibility or high reflectivity, e.g., silver (Ag).

A pixel defining layer 109 is formed on the planarization layer 107. The pixel defining layer 109 may include one or more inorganic insulating materials selected from the group of polyimide, polyamide, acrylic resin, benzocyclobutene, and phenol resin, and may be formed by using a spin coating method or the like. The pixel defining layer 109 covers an edge of the pixel electrode 111, and includes an opening 109a that opens at least a central portion of the pixel electrode 111. An area defined by the opening 109a corresponds to a pixel, e.g., a light-emitting area of the pixel, and the intermediate layer 113 is formed in the opening 109a.

The intermediate layer 113 may include an organic emission layer that emits red, green, or blue light, and the organic emission layer may use a low molecular organic material or a high molecular organic material. When the organic emission layer is a low molecular organic layer including a low molecular organic material, a hole transport layer (HTL) and a hole injection layer (HIL) are placed in the direction of the pixel electrode 111 based on the organic emission layer, and an electron transport layer (ETL) and an electron injection layer (EIL) are stacked in the direction of the opposite electrode 112 based on the organic emission layer. In addition to the HIL, the HTL, the ETL, and the EIL, various layers may also be stacked in the intermediate layer 113 as desired.

In the embodiment described above, a case in which a separate organic emission layer is formed for each pixel is illustrated as an example. In this case, each of red light, green light, and blue light may be emitted for each pixel. In an implementation, an organic emission layer may be formed to be common to all pixels placed in the display area DA. For example, a plurality of organic emission layers, which emit red light, green light, and blue light, may be vertically stacked or mixed, thereby emitting white light. A color combination for emitting white light is not limited thereto. In this case, a color conversion layer or color filter that converts emitted white light into a predetermined color may be provided separately.

Next, the opposite electrode 112 is formed to cover the entire pixel defining layer 109. The opposite electrode 112 may include a conductive inorganic material. When the opposite electrode 112 functions as a cathode, the opposite electrode 112 may include lithium (Li), calcium (Ca), LiF/Ca, LiF/Al, aluminum (Al), magnesium (Mg), or silver (Ag), which has a low work function. Layers including metals stated above may be formed as a thin film to enable light transmission. The opposite electrode 112 may be formed as a common electrode over the entire display area DA in which an image is implemented. The opposite electrode 112 may be formed by using an evaporation process that does not damage the intermediate layer 113. The polarity of the opposite electrode 112 and the polarity of the pixel electrode 111 may be opposite to each other.

An insulation capping layer 114 may be further formed on the opposite electrode 112. The insulation capping layer 114 may maintain a work function of the opposite electrode 112 when an encapsulation layer 100b is formed by using a sputtering process or plasma enhanced chemical vapor deposition (PECVD) process, and may help prevent an organic material included in the intermediate layer 113 from being damaged. The insulation capping layer 114 is an optional element and may not be provided.

The encapsulation layer 100b may be formed above the entire flexible display substrate 100a to cover both the display area DA and the non-display area NDA. The encapsulation layer 100b is formed to protect the organic light-emitting device OLED from external moisture or oxygen. The encapsulation layer 100b may include a multi-layer or single layer including an insulation inorganic material. In an implementation, the insulation inorganic material may be metal oxide or metal nitride, e.g., the insulation inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

The encapsulation layer 100b may have an encapsulation structure in which a thin film including an organic material and a thin film including an inorganic material are alternately stacked on a film including an insulation inorganic material. In this case, an organic layer, i.e., the thin film including an organic material, may include a polymer, and may be a single layer or stacked layer including any one selected from polyethylene terephthalate, polyimide, polycarbonate, epoxy, polyethylene, and polyacrylate.

In the encapsulation structure, the uppermost layer exposed to the outside may be an inorganic layer to help prevent moisture permeation into the organic light-emitting device OLED. The encapsulation structure may include at least one sandwich structure in which at least one organic layer is inserted between at least two inorganic layers. Also, the encapsulation structure may include at least one sandwich structure in which at least one inorganic layer is inserted between at least two organic layers.

According to the current embodiment, the flexible display panel 100 may be bent, folded, or unfolded by adopting the encapsulation layer 100b that includes the flexible display substrate 100b and a thin film and thus is flexible.

Figure 20:
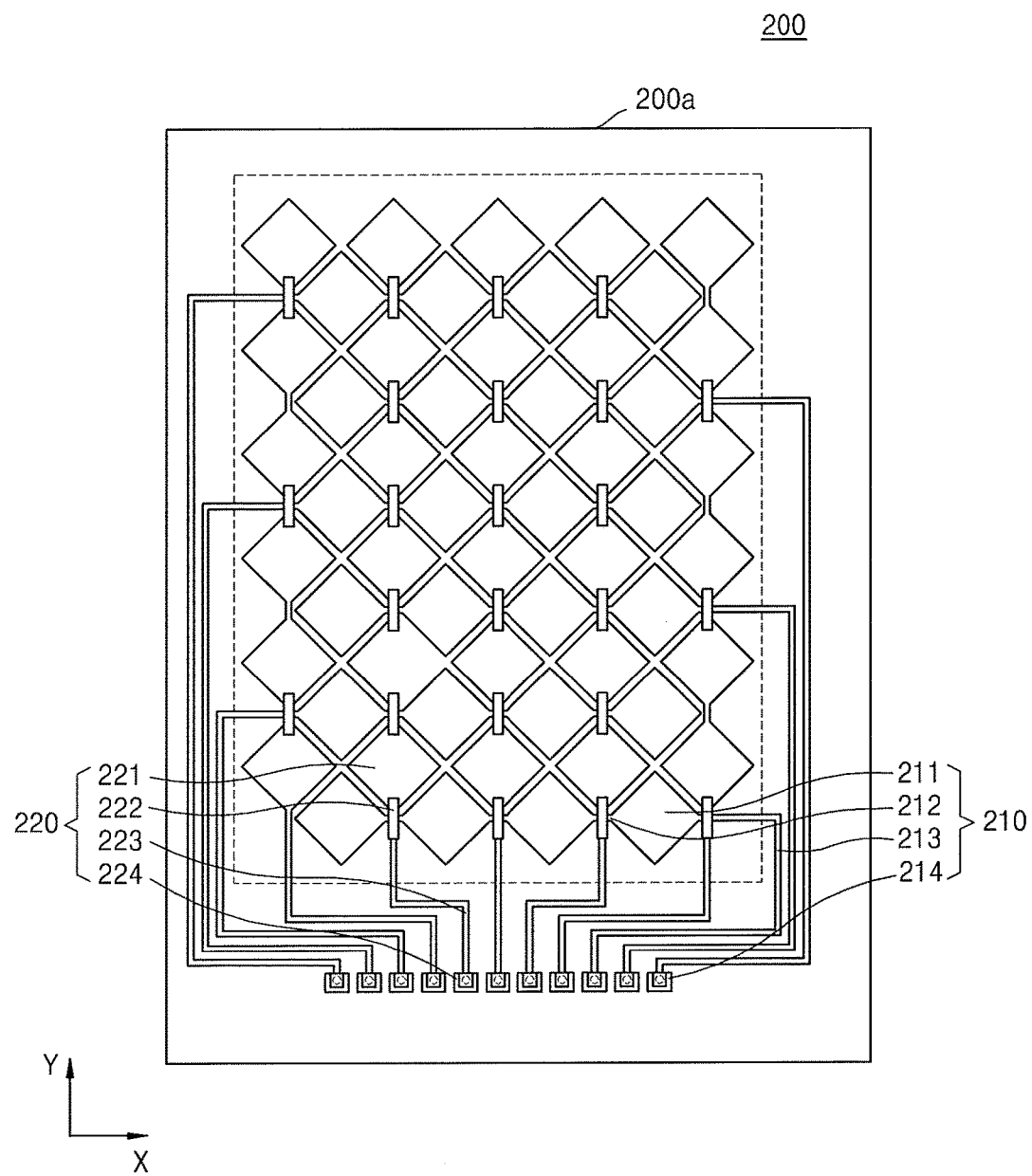
FIG. 20 illustrates a plan view of a touch screen panel of FIG. 18.

FIG. 20 illustrates a plan view of the touch screen panel 200 of FIG. 18.

For example, the touch screen panel 200 shown in FIG. 20 generates an electrical signal according to a touch of a user and operates in response to the generated electrical signal. FIG. 20 illustrates an example in which the touch screen panel 200 is an electrostatic capacitive type touch screen panel. In an implementation, the touch screen panel 200 may be a resistive type touch screen panel, an electro-magnetic type touch screen panel, a surface acoustic wave type touch screen panel, or an infrared type touch screen panel.

A flexible touch substrate 200a is prepared. The flexible touch substrate 200a includes a flexible material that is bendable or foldable, like the flexible display substrate 100a. A plurality of first electrode pattern units 210 and a plurality of second electrode pattern units 220 are alternately arranged on the flexible touch substrate 200a.

The first electrode pattern units 210 are formed along a line with respective edges thereof into contact with each other in a first direction (X direction) of the flexible touch substrate 200a. A second electrode pattern unit 220 is placed between a pair of first electrode pattern units 201 that are adjacent to each other. The second electrode pattern units 220 are formed along a line with respective edges thereof into contact with each other in a second direction (Y direction) of the flexible touch substrate 200a.

The first electrode pattern units 210 include a plurality of first body portions 211, a plurality of first connection portions 212, a plurality of first extension portions 213, and a plurality of first joining portions 214.

Each of the plurality of first body portions 211 has a rhombus shape. A plurality of first body portions 211 are formed along a line in the first direction (X direction) of the flexible touch substrate 200a. Each of the plurality of first connection portions 212 is formed between a pair of first body portions 211 arranged adjacent to each other in the first direction (X direction). Each of the plurality of first connection portions 212 connects a pair of first body portions 211 to each other. Each of the plurality of first extension portions 213 extends from one end of a first electrode pattern unit 210 corresponding thereto. The plurality of first extension portions 213 extend to the edge of the flexible touch substrate 200a and are assembled in one side of the flexible touch substrate 200a. Each of the plurality of first joining portions 214 is formed in an end portion of a first extension portion 213 corresponding thereto.

The second electrode pattern units 220 include a plurality of second body portions 221, a plurality of second connection portions 222, a plurality of second extension portions 223, and a plurality of second joining portions 224. Each of the plurality of second body portions 221 is formed in a rhombus shape. A plurality of second body portions 221 are formed in a line in the second direction (Y direction) of the flexible touch substrate 200a. Each of the plurality of second extension portions 223 extends from one end of a second electrode pattern unit 220 corresponding thereto. The plurality of second extension portions 223 extend to the edge of the flexible touch substrate 200a and are assembled in one side of the flexible touch substrate 200a. Each of the plurality of second joining portions 224 is formed in an end portion of a second extension portion 223 corresponding thereto.

In this case, with respect to a pair of first electrode patterns 210 placed adjacent to each other, a pair of first body portions 211 are connected to each other by a first connection portion 212 placed on the same plane. On the other hand, with respect to a pair of second electrode patterns 220 placed adjacent to each other, a pair of second body portions 221 are connected to each other by a second connection portion 222 placed on different planes to avoid interference with the first electrode pattern units 210. Each of the first and second electrode pattern units 210 and 220 may include a transparent conductive material, for example, a transparent material such as ITO, IZO, ZnO, or $In_2O_3$.

When an input means such as a finger approaches or touches the touch screen panel 200 having the structure as described above, the touch screen panel 200 detects a touch position by measuring capacitance that varies between the first electrode pattern unit 210 and the second electrode pattern unit 220. According to the embodiment, the touch screen panel 200 may be easily bent, folded, or unfolded because the flexible touch substrate 200a uses a flexible material.

Figure 21:
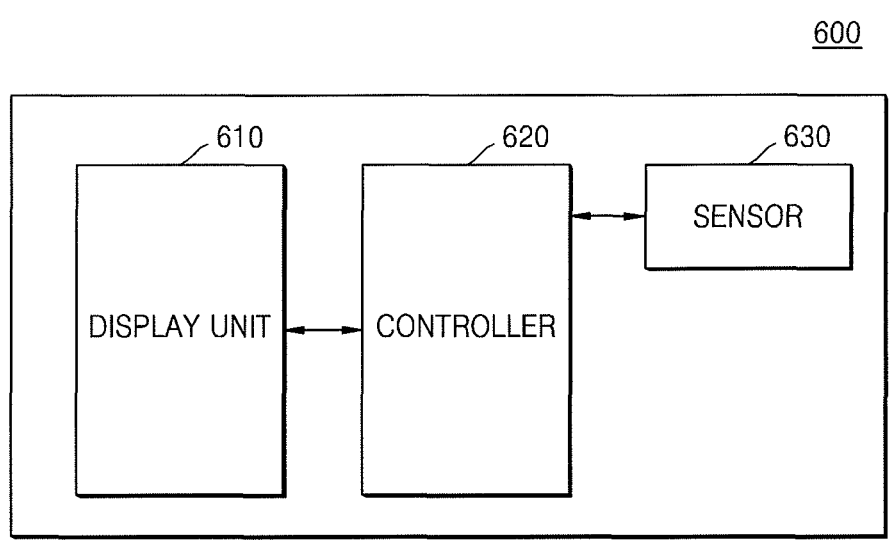
FIG. 21 illustrates a block diagram of a flexible display device according to an embodiment.

FIG. 21 illustrates a block diagram of a flexible display device 600 according to an embodiment.

For example, the flexible display device 600 may include a display unit 610 including a display area, a sensor 630 for detecting the form of the display unit 610, and a controller 620 for controlling an operation of the display unit 610 according to a detection result of the sensor 630.

The display unit 610 may include a thin film transistor and an organic light-emitting device OLED. The sensor 630 detects the form of the flexible display device 600. For example, the sensor 630 may detect a folding operation and an unfolding operating of the flexible display device 600.

In an implementation, the sensor 630 may detect an operation when the state of the flexible display device 600 changes from a folded state to an unfolded state or an operation when the state of the flexible display device 600 changes from an unfolded state to a folded state by using a hall sensor or a magnetic sensor.

A state detection sensor of the sensor 630 may be placed at points that approach each other when the flexible display device 600 is bent or folded, thereby detecting a folded state. The state detection sensor may include at least one selected from a proximity sensor, an illuminance sensor, a magnetic sensor, a hall sensor, a touch sensor, a bending sensor, an infrared sensor, and a combination thereof.

In an implementation, the sensor 630 may detect whether the current state of the flexible display device 600 is an unfolded state or a folded state, and may also detect a folding operation or an unfolding operation when the current state of the flexible display device 600 changes.

The controller 620 may control an operation of the display unit 610 according to a detection result of the sensor 630. For example, controller 620 may block signals and power supplied to the display unit 610 when the flexible display device 600 is in a folded state. When the display unit 610 is a double-sided emission type display unit, the controller 620 may adjust a size and layout of a screen according to a folded state and an unfolded state of the flexible display device 600 when another screen is implemented via a substrate (e.g., the flexible display substrate 100a of FIG. 19) exposed to the outside in a folded state.

By way of summation and review, a window cover provided on the encapsulation layer of a flexible display device may have a flexible film structure that may be bent or folded. In addition, the flexible film structure of the window cover that forms a surface of the flexible display device may have high transmissivity and a predetermined hardness regardless of a bending or folding property so as to withstand external impacts.

The embodiments may provide a flexible film structure having high transmissivity and high durability, such as high hardness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display device, comprising:
   a flexible display panel configured to display an image on at least one surface thereof; and
   a window cover on the at least one surface of the flexible display panel,
   wherein the window cover includes a flexible film structure, the flexible film structure including a base film, at least one first functional hard coating layer on a first side the base film, and a lower functional hard coating layer on a second side of the base film, the second side of the base film being opposite to the first side of the base film,
   wherein the at least one first functional hard coating layer includes a siloxane polymer having an epoxy group,
   wherein the lower functional hard coating layer includes a siloxane polymer having an epoxy group,
   wherein the flexible film structure has a thickness of about 100 µm or less and a transmissivity of about 90% to 92% for light having a wavelength of about 450 nm to 700 nm, and
   wherein the flexible film structure further includes a barrier layer on the at least one first functional hard coating layer and a second functional hard coating layer on the barrier layer, the second functional hard coating layer including a siloxane polymer having an epoxy group.

2. The flexible display device as claimed in claim 1, wherein the base film includes a glass film, a plastic film, or a metal film.

3. The flexible display device as claimed in claim 1, wherein:
   a weight-average molecular weight of each siloxane polymer is about 1,500 g/mole to 2,100 g/mole, and
   a number-average molecular weight of each siloxane polymer is about 1,300 g/mole to 1,700 g/mole.

4. The flexible display device as claimed in claim 1, wherein the flexible film structure further includes a transmissivity enhancement layer on the at least one first functional hard coating layer.

5. The flexible display device as claimed in claim 1, further comprising an adhesive layer between the window cover and the flexible display panel, the adhesive layer adhering the window cover with the flexible display panel.

6. The flexible display device as claimed in claim 1, wherein the flexible film structure further includes a transparent electrode layer on the second functional hard coating layer.

7. The flexible display device as claimed in claim 1, wherein the flexible display panel includes:
   at least one thin film transistor on a foldable substrate;
   an insulating layer covering the at least one thin film transistor;
   an organic light-emitting device on the insulating layer and electrically connected to the thin film transistor, the organic light-emitting device being configured to emit light from an organic emission layer between electrodes thereof; and
   an encapsulation layer on the foldable substrate, the encapsulation layer sealing the organic light-emitting device.

8. The flexible display device as claimed in claim 7, further comprising:
   a touch screen panel adhered to the encapsulation layer with an adhesive, the touch screen panel being foldable and configured to sense a touch input from the at least one first functional hard coating layer; and
   an optical film adhered to the touch screen panel with an adhesive, the optical film being configured to prevent reflection of external light.

9. A flexible display device, comprising:
   a flexible display panel that displays an image on at least one surface thereof; and
   a window cover on the at least one surface of the flexible display panel,
   wherein the window cover includes a flexible film structure, the flexible film structure including a base film, a first functional hard coating layer on one side the base film, and a second functional hard coating layer on the other side of the base film, the other side of the base film being opposite to the one side of the base film,
   wherein the first functional hard coating layer includes a siloxane polymer that is crosslinked via an epoxy group,
   wherein the second functional hard coating layer includes a siloxane polymer that is crosslinked via an epoxy group,
   wherein the flexible film structure has a thickness of about 100 µm or less and a transmissivity of about 90% to 92% for light having a wavelength of about 450 nm to 700 nm, and
   wherein the flexible film structure further includes:
   a barrier layer on the first functional hard coating layer, and
   a third functional hard coating layer on the barrier layer, the third functional hard coating layer including a siloxane polymer that is crosslinked via an epoxy group.

10. The flexible display device as claimed in claim 9, wherein:
    a weight-average molecular weight of each siloxane polymer is about 1,500 g/mole to 2,100 g/mole, and
    a number-average molecular weight of each siloxane polymer is about 1,300 g/mole to 1,700 g/mole.

11. The flexible display device as claimed in claim 9, wherein the flexible film structure further includes a transparent electrode layer on the third functional hard coating layer.

12. The flexible display device as claimed in claim 9, wherein the flexible display device is foldable about at least one axis such that a display area of flexible display panel faces an interior of the flexible display device.

13. The flexible display device as claimed in claim 12, wherein the flexible display panel includes a sensor such that display of an image by the flexible display panel is stopped when the flexible display device is folded such that the display area of flexible display panel faces the interior of the flexible display device.

14. The flexible display device as claimed in claim 9, wherein the base film includes a glass film, a plastic film, or a metal film.

15. The flexible display device as claimed in claim 9, wherein the flexible film structure further includes a transmissivity enhancement layer on the first functional hard coating layer.

16. The flexible display device as claimed in claim 9, further comprising an adhesive layer between the window cover and the flexible display panel, the adhesive layer adhering the window cover with the flexible display panel.

* * * * *